United States Patent [19]

Wilke

[11] Patent Number: 4,728,816
[45] Date of Patent: Mar. 1, 1988

[54] ERROR AND CALIBRATION PULSE GENERATOR

[75] Inventor: William G. Wilke, Arlington, Mass.

[73] Assignee: Tektronix, Inc., Beaverton, Oreg.

[21] Appl. No.: 864,043

[22] Filed: May 16, 1986

[51] Int. Cl.⁴ .............................................. H03K 3/017
[52] U.S. Cl. .................................... 307/265; 307/608; 328/58; 328/59
[58] Field of Search ............... 307/265, 267, 593, 268, 307/597, 608, 269, 480, 529; 328/58, 55, 66, 63, 129.1, 111

[56] References Cited

U.S. PATENT DOCUMENTS

| | | | |
|---|---|---|---|
| 3,614,632 | 10/1971 | Leibowitz | 328/58 |
| 3,838,297 | 9/1974 | Bardo et al. | 307/265 |
| 4,566,111 | 1/1986 | Tanagawa | 328/129.1 |
| 4,641,044 | 2/1987 | Shiraishi | 307/265 |

Primary Examiner—Stanley D. Miller
Assistant Examiner—Timothy P. Callahan
Attorney, Agent, or Firm—John Smith-Hill

[57] ABSTRACT

An electronic circuit for selectively generating two output pulses that differ in duration by a predetermined amount has a clock terminal for receiving clock transitions at precisely determined intervals and comprises first and second sequential logic devices, a combinational logic device and a network that couples the clock terminal of the circuit to the sequential logic devices and also couples the second sequential logic device to the combinational logic device. The first and second sequential logic devices each have a data input terminal, a clock input terminal and an output terminal, and each has a first state in which the output terminal is at one of two binary logic levels and a second state in which the output terminal is at the other of the two binary logic levels. The combinational logic device has a first input terminal coupled to the output terminal of the first sequential logic device, a second input terminal coupled to the output terminal of the second sequential logic device, and an output terminal at which the desired two output pulses are provided. The coupling network has first and second separately selectable states such that in the first state of the coupling network a change in the state of the first sequential logic device brings about a change in the state of the second sequential logic device after a first predetermined number of clock transitions, whereas in the second state of the coupling network a change in the state of the first sequential logic device brings about a change in the state of the second sequential logic device after a second predetermined number of clock transitions, the second number being different from the first number.

11 Claims, 4 Drawing Figures

ERROR AND CALIBRATION PULSE GENERATOR

This invention relates to an error and calibration pulse generator.

BACKGROUND OF THE INVENTION

A conventional universal timer/counter (UTC) makes single-shot pulse duration measurements by counting the number of periods of the master clock that occur between the beginning and end of the pulse to be measured. The resolution of the UTC is therefore limited by the master clock period. FIG. 1 illustrates an arrangement which permits the measurement resolution of the UTC to be improved. As shown in FIG. 1, the input pulse is applied to a timer 2 and to a start error pulse generator 4 and a stop error pulse generator 6. The start error pulse generator generates a start error pulse of duration equal to the interval between the beginning of the input pulse to be measured and the arrival of the next subsequent clock edge. Similarly the stop error pulse generator generates a stop error pulse of duration equal to the interval between the end of the input pulse to be measured and the arrival of the next subsequent clock edge. The start and stop error pulses are used to charge respective capacitors. The capacitors are later discharged at a known lower rate and the time that each capacitor takes to discharge is measured. If, for example, the discharge rate is one hundredth of the charge rate, the discharge time would be one hundred times the error time, and if the discharge time is measured with the clock's resolution, the single-shot resolution of the UTC is improved by a factor of one hundred. Such capacitive pulse stretchers are well known.

The start error pulse generator shown in FIG. 1 is of conventional form.

Before carrying out a measurement, the pulse generator is armed by placing each of the flip-flops 12 and 14 in its reset condition, so that each of them has a logical 0 (low) at its Q output terminal and a logical 1 (high) at its /Q output terminal. The pulse generator is then enabled by placing a logical 1 at the D input terminal of the flip-flop 12.

The input pulse to be measured is applied to the pulse generator by way of a signal input terminal 16, which is connected to the clock input terminal of the flip-flop 12. The input pulse is also applied to the timer 2 and to the stop time pulse generator 6. The start of the input pulse is marked by a positive-going transition at the terminal 16, from logical 0 to logical 1. In response to this transition, the Q terminal of the flip-flop 12 goes high and its /Q terminal goes low. When the /Q terminal of the flip-flop 12 goes low, the NOR gate 18 receives two low inputs and the output of the NOR gate goes high. This is the start of the start error pulse. When the next subsequent clock edge occurs, it is applied to the clock input terminal of flip-flop 14 and the Q terminal of the flip-flop 14 goes high and the output terminal of the NOR gate 18 goes low, marking the end of the start error pulse.

The stop error pulse generator 6 responds to the negative-going transition at the end of the input pulse and generates a stop error pulse having a duration equal to the difference between the time of arrival of the negative-going transition and the next subsequent clock edge.

The timer 2 counts the number of pulses between the first clock edge and the clock edge following the end of the input pulse.

The duration of the pulse to be measured is then equal to the number of clock periods counted by the timer 2 multiplied by the clock period, plus the duration of the start error pulse, minus the duration of the stop error pulse.

In order to provide accurate and consistent measurements, it is necessary to calibrate the capacitive pulse stretcher and its associated circuitry. In many applications, good measurement practice requires that the pulse stretcher be calibrated once per measurement. Conventional start and stop error pulse generators do not permit calibration of the pulse stretcher without interfering with the pulse generators when in the measurement mode.

SUMMARY OF THE INVENTION

In accordance with the present invention, an electronic circuit for selectively generating two output pulses that differ in duration by a predetermined amount has a clock terminal for receiving clock transitions at precisely determined intervals and comprises first and second sequential logic devices, a combinational logic device and a network that couples the clock terminal of the circuit to the sequential logic devices and also couples the second sequential logic device to the combinational logic device. The first and second sequential logic devices each have a data input terminal, a clock input terminal and an output terminal, and each has a first state in which the output terminal is at one of two binary logic levels and a second state in which the output terminal is at the other of the two binary logic levels. The combinational logic device has a first input terminal coupled to the output terminal of the first sequential logic device, a second input terminal coupled to the output terminal of the second sequential logic device, and an output terminal at which the desired two output pulses are provided. The coupling network has first and second separately selectable state such that in the first state of the coupling network a change in the state of the first sequential logic device brings about a change in the state of the second sequential logic device after a first predetermined number of clock transitions, whereas in the second state of the coupling network a change in the state of the first sequential logic device brings about a change in the state of the second sequential logic device after a second predetermined number of clock transitions, the second number being different from the first number.

BRIEF DESCRIPTION OF THE DRAWINGS

For a better understanding of the invention, and to show how the same may be carried into affect, reference will now be made, by way of example, to the accompanying drawings in which.

DETAILED DESCRIPTION

Figure 1:
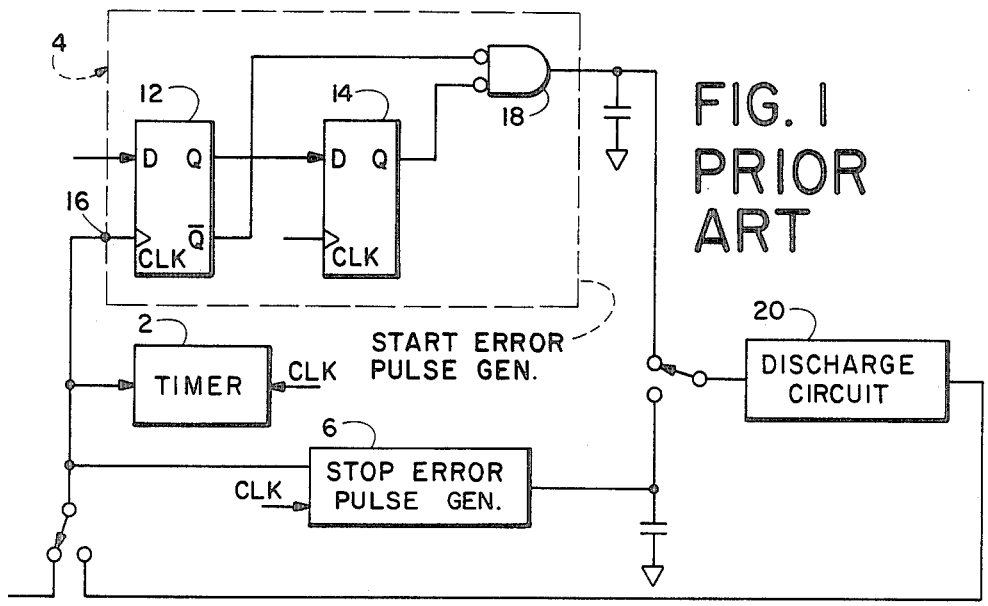
FIG. 1 is block diagram of a UTC including a conventional start error pulse generator.
Figure 2:
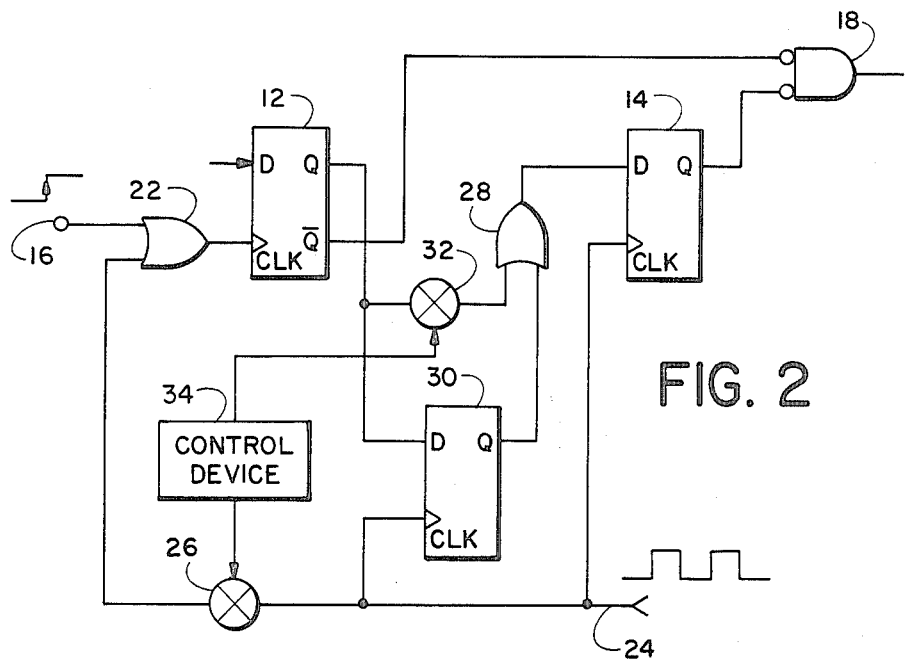
FIG. 2 is a block diagram of a first start error and calibration pulse generator embodying the present invention.

The circuit shown in FIG. 2 is similar to that shown in FIG. 1, except that it also enables two calibration pulses, the difference in duration of which is precisely known, to be generated. The FIG. 2 circuit thus has a measurement mode and a calibration mode.

The signal input terminal 16 of the circuit shown in FIG. 2 is connected to the clock terminal of the flip-flop 12 through an OR gate 22. The master clock terminal 24 of the FIG. 2 pulse generator is connected to the OR gate 22 through a switch 26. The Q terminal of the flip-flop 12 is connected to the D terminal of the flip-flop 14 through a network which comprises an OR gate 28, a flip-flop 30 and a second switch 32. In the measurement mode, a control device 34 renders the switch 26 non-conductive and the switch 32 conductive. In the measurement mode, the FIG. 2 circuit operates in the same manner as the FIG. 1 start error pulse generator.

In the calibration mode, the switch 26 is conductive, and the signal input terminal 16 is isolated from the signal source. The circuit is armed by placing each flip-flop in its reset condition, and the circuit is enabled by placing a logical 1 at the D terminal of the flip-flop 12. The circuit is set to generate a short calibration pulse by placing the switch 32 in its conductive state. The first positive-going clock edge applied to the clock terminal of the flip-flop 12 through the OR gate 22 causes the Q terminal of the flip-flop 12 to go high, and the /Q terminal to go low. The output terminal of the NOR gate 18 goes high, signifying the start of the short calibration pulse. The logical 1 at the Q terminal of the flip-flop 12 is transmitted through the switch 32 and the OR gate 28 to the D input of the flip-flop 14. On arrival of the next clock pulse, the Q output of the flip-flop 14 goes high, and the output of the NOR gate 18 goes low, signifying the end of the short calibration pulse.

In order to generate a long calibration pulse, the circuit is again armed and enabled, but the switch 32 is rendered non-conductive. When the first clock pulse is received at the clock input terminal of the flip-flop 12, the /Q terminal of the flip-flop 12 goes low and, as before, the output of the NOR gate 18 goes high. However, because the switch 32 is non-conductive, the high at the Q terminal of the flip-flop 12 is not applied to the D terminal of the flip-flop 14. When the second clock pulse arrives, the Q output of the flip-flop 30 goes high, and this high is applied to the D terminal of the flip-flop 14 through the gate 28. On arrival of the third clock pulse, the Q terminal of the flip-flop 14 goes high. The output of the NOR gate 18 goes low, signifying the end of a long calibration pulse.

If the delay through one of the circuit blocks shown in FIG. 2 is represented by $D_i$, where i is the reference numeral associated with that block, and the clock period is represented by T, then the duration of the short calibration pulse is equal to $T+D_{14}-(D_{26}+D_{22}+D_{12})$. The duration of the long calibration pulse is equal to $2T+D_{14}-(D_{26}+D_{22}+D_{12})$. The difference between the durations of the short and long calibration pulses is equal to T (a known value), while the difference $(D_{14}-(D_{26}+D_{22}+D_{12}))$ between the duration of the short pulse and T is equal to the internal delay of the circuit. Thus, if the short calibration pulse and the long calibration pulse are applied successively to a capacitive pulse stretcher, the gain and offset of the pulse stretcher can both be measured.

Figure 3:
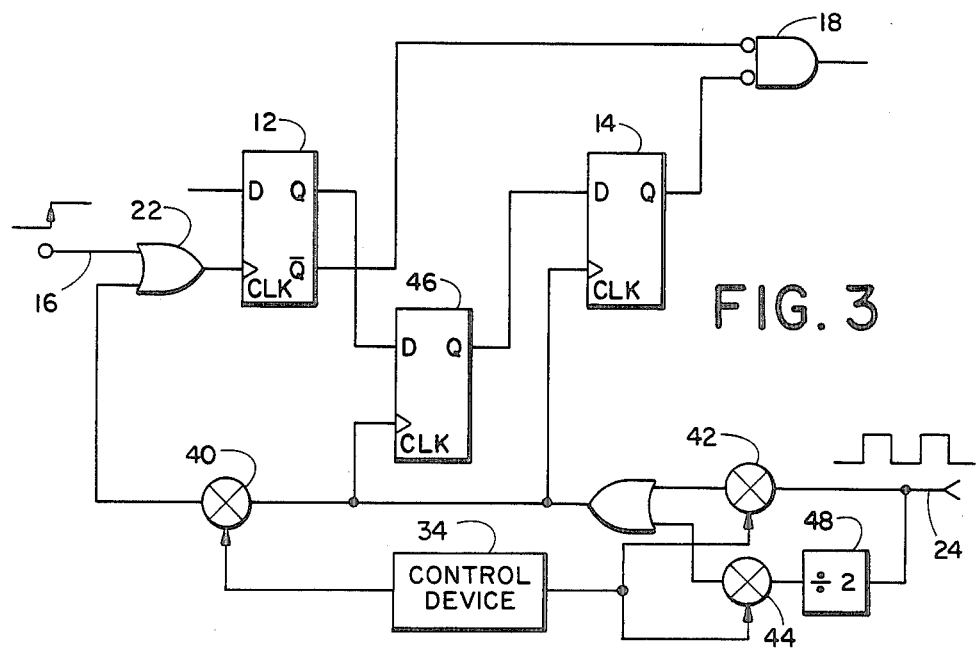
FIG. 3 is a block diagram of a second start error and calibration pulse generator embodying the present invention.

A second start error and calibration pulse generator is shown in FIG. 3. In the measurement mode, the pulse generator is armed and enabled, and the switches 40 and 44 are non-conductive and the switch 42 is conductive. When the input terminal 16 of the circuit goes high, the /Q output of the flip-flop 12 goes low. Since the Q output of the flip-flop 14 is already low, the output of the NOR gate 18 goes high. When the /Q output of the flip-flop 12 went low, its Q output went high. Therefore, on the first clock pulse following the transition at the terminal 16, the Q output of the flip-flop 46 goes high, and on the second clock pulse the Q output of the flip-flop 14 goes high and the output of the NOR gate 18 goes low. In the calibration mode, the signal input terminal 16 is isolated and held low. The switch 40 is conductive, and for generating a short calibration pulse, the switch 44 remains non-conductive and the switch 42 remains conductive. At the first positive clock edge, the /Q output of the flip-flop 12 goes low and the output of the NOR gate 18 goes high. On the second clock edge, the Q output of the flip-flop 46 goes high, and on the third clock edge the Q output of the flip-flop 14 goes high and the output of the NOR gate 18 goes low. The duration of the short clock pulse is $2T+D_{12}+D_{14}+D_{40}$.

In order to generate a long calibration pulse, the switch 42 is non-conductive and the switch 44 is conductive. Clock pulses at the terminal 24 are applied to a frequency scaler 48, and therefore clock edges are applied to the circuit at half the frequency at which clock edges arrive at the terminal 24. The operation of the FIG. 3 circuit in generating the long calibration pulse will be self-evident, and it will also be apparent that the duration of the long clock pulse is equal to $4T+D_{12}+D_{14}+D_{40}$. The difference between the duration of the short and long calibration pulses is then equal to 2T.

Figure 4:
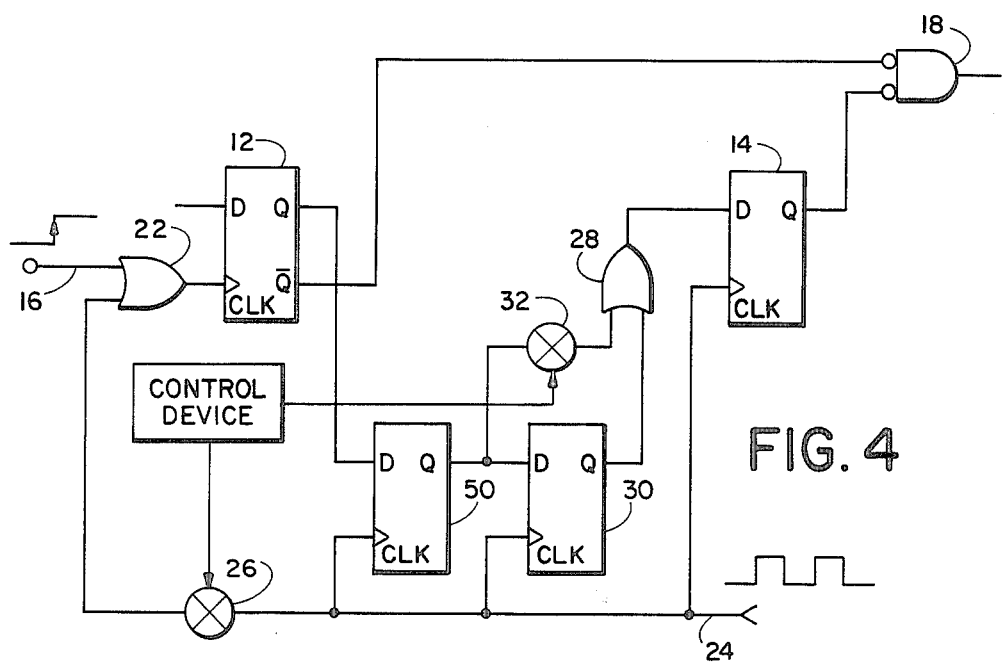
FIG. 4 is a block diagram of a third start error and calibration pulse generator embodying the present invention.

When the circuit shown in FIG. 4 is in the start error mode, the switches 26 and 32 are non-conductive and conductive respectively, and the output of the NOR gate 18 goes high in response to the positive edge of the input signal applied to the terminal of the circuit. Three clock pulses later, the output of the NOR gate goes low, indicating the end of the start error pulse. In the calibration mode, the switch 26 is conductive, and the switch 32 is conductive for generating a short calibration pulse. At the first clock pulse, the /Q output of the flip-flop 12 goes high and the output of the NOR gate 18 goes low, as in the case of FIG. 2. On the second clock pulse, the Q output of the flip-flop 50 goes high, and on the third clock pulse the Q output of the flip-flop 14 goes high. The output of the NOR gate 18 goes low, marking the end of the short calibration pulse. When the switch 32 is non-conductive, the same sequence of events occurs except that on the third clock pulse the output of the flip-flop 30 goes high and it is not until the fourth clock pulse that the output of the flip-flop 14 goes high and the output of the NOR gate 18 goes low.

It will be appreciated that the present invention is not restricted to the particular circuits that have been described and illustrated, and that variations may be made therein without departing from the scope of the invention as defined in the appended claims and equivalents thereof. For example, it is not necessary to use both outputs of the flip-flop 12, since the /Q output can be generated from the Q output by inversion. If the NOR gate 18 is replaced by an AND gate and the /Q output of the flip-flop 14 is applied to one input of the AND gate, the Q output of the flip-flop 12 may be applied directly, i.e., without inversion, to the other input of the AND gate.

I claim:

1. An electronic circuit for selectively generating first and second output pulses which differ in duration by a predetermined amount, said circuit having a clock terminal for receiving clock transitions at precisely determined intervals and comprising:

a first sequential logic device having a data input terminal, a clock input terminal, and at least one output terminal, said first sequential logic device having a first state in which the output terminal is at a first of two binary logic output levels and a second state in which the output terminal is at the second of the two binary logic output levels, and said first sequential logic device being placed in its first state when a clock transition is received at the clock input terminal while the data input terminal is at a first of two binary logic input levels and being placed in its second state when a clock transition is received at the clock input terminal while the data input terminal is at the second of said two binary logic input levels, a second sequential logic device having a data input terminal, a clock input terminal, and at least one output terminal, said second sequential logic device having a first state in which the output terminal is at one of said first and second binary logic output levels and a second state in which the output terminal is at the other of said first and second binary logic output levels, and said second sequential logic device being placed in its first state when a clock transition is received at the clock input terminal while the data input terminal is at one of said first and second binary logic input levels and being placed in its second state when a clock transition is received at the clock input terminal while the data input terminal is at the other of said first and second binary logic input levels, a combinational logic device having a first input terminal coupled to the output terminal of the first sequential logic device, a second input terminal coupled to the output terminal of the second sequential logic device, and an output terminal, means coupling the clock terminal of the circuit to the clock input terminals of the first and second sequential logic devices and coupling the output terminal of the first sequential logic device to the data input terminal of the second sequential logic device, and control means for selectively placing the coupling means in a first state such that a change in the state of the first sequential logic device brings about a change in the state of the second sequential logic device after a first predetermined number of clock transitions and the combinational logic device generates said first output pulse at its output terminal, or in a second state such that a change in the state of the first sequential logic device brings about a change in the state of the second sequential logic device after a second predetermined number of clock transitions, said second number being different from said first number, and the combinational logic device generates said second output pulse, having a different duration from said first output pulse, at its output terminal.

2. An electronic circuit for selectively generating first and second output pulses which differ in duration by a predetermined amount, said circuit having a clock terminal for receiving clock transitions at precisely determined intervals and comprising:

a first sequential logic device having a data input terminal, a clock input terminal, and first and second complementary output terminals, said first sequential logic device having a first state in which the first and second output terminals are at first and second binary logic output levels respectively and a second state in which the first and second output terminals are at said second and first binary logic output levels respectively, and said first sequential logic device being placed in its first state when a clock transition is received at the clock input terminal while the data input terminal is at a first of two binary logic input levels and being placed in its second state when a clock transition is received at the clock input terminal while the data input terminal is at the second of said two binary logic input levels, a second sequential logic device having a data input terminal, a clock input terminal, and at least one output terminal, said second sequential logic device having a first state in which the output terminal is at one of said first and second binary logic output levels and a second state in which the output terminal is at the other of said first and second binary logic output levels, and said second sequential logic device being placed in its first state when a clock transition is received at the clock input terminal while the data input terminal is at one of said first and second binary logic input levels and being placed in its second state when a clock transition is received at the clock input terminal while the data input terminal is at the other of said first and second binary logic input levels, a combinational logic device having a first input terminal coupled to one of the first and second output terminals of the first sequential logic device, a second input terminal coupled to the output terminal of the second sequential logic device, and an output terminal, means coupling the clock terminal of the circuit to the clock input terminals of the first and second sequential logic devices and coupling the other of the first and second output terminals of the first sequential logic device to the data input terminal of the second sequential logic device, and control means for selectively placing the coupling means in a first state such that the binary logic output level present at said other output terminal of the first sequential logic device is propagated to the data input terminal of the second sequential logic device by a first predetermined number of clock transitions and the combinational logic device generates said first output pulse at its output terminal, or in a second state such that the binary logic output level present at said other output terminal of the first sequential logic device is propagated to the data input terminal of the second sequential logic device by a second predetermined number of clock transitions, said second number being different from said first number, and the combinational logic device generates said second output pulse, having a different duration from said first output pulse, at its output terminal.

3. A circuit according to claim 2, wherein the coupling means comprise:

a third sequential logic device having a data input terminal, a clock input terminal, and an output terminal, and having a first state in which the output terminal is at said first binary logic output level and a second state in which the output terminal is at said second binary logic output level, and being placed in its first state when a clock transition is received at the clock input terminal while the data input terminal is at one of said first and second binary logic input levels and being placed in its second state when a clock transition is received at the clock input terminal while the data input terminal is at the other of said first and second binary logic input levels, the data input terminal of the third sequential logic device being connected to said other output terminal of the first sequential logic device, a switch having an input terminal connected to said other output terminal of the first sequential logic device and also having an output terminal, said switch having a conductive state in which the binary logic level present at said other output terminal of the first sequential logic device is propagated to the output terminal of the switch and having a non-conductive state in which the output terminal of the switch is isolated from said other output terminal of the first sequential logic device, and a second combinational logic device having first and second input terminals connected respectively to the output terminal of the switch and the output terminal of the third sequential logic device, and also having an output terminal connected to the data input terminal of the second sequential logic device, and wherein the control mean place the coupling means in the first or second state thereof by placing the switch in its conductive state or its non-conductive state.

4. A circuit according to claim 2, wherein the coupling means comprise:

third and fourth sequential logic devices each having a data input terminal, a clock input terminal and an output terminal and each having a first state in which the output terminal is at said first binary logic output level and a second state in which the output terminal is at said second binary logic output level and being placed in its first state when a clock transition is received at the clock input terminal while the data input terminal is at one of said first and second binary logic input levels and being placed in its second state when a clock transition is received at the clock input terminal while the data input terminal is at the other of said first and second binary logic input levels, the data input terminal of the third sequential logic device being connected to said other output terminal of the first sequential logic device and the output terminal of the third sequential logic device being connected to the data input terminal of the fourth sequential logic device, a switch having an input terminal connected to the output terminal of the third sequential logic device and also having an output terminal, said switch having a conductive state in which the binary logic level present at the output terminal of the third sequential logic device is propagated to the output terminal of the switch and having a non-conductive state in which the output terminal of the switch is isolated from the output terminal of the third sequential logic device, and a second combinational logic device having first and second input terminals connected respectively to the output terminal of the switch and the output terminal of the fourth sequential logic device, and also having an output terminal connected to the data input terminal of the second sequential logic device, and wherein the control mean place the coupling means in the first or second state thereof by placing the switch in its conductive state or its non-conductive state.

5. A circuit according to claim 2, wherein the coupling means comprise:

a third sequential logic device having a data input terminal, a clock input terminal and an output terminal, and having a first state in which the output terminal is at said first binary logic output level and a second state in which the output terminal is at said second binary logic output level, and being placed in its first state when a clock transition is received at the clock input terminal while the data input terminal is at one of said first and second binary logic input levels and being placed in its second state when a clock transition is received at the clock input terminal while the data input terminal is at the other of said first and second binary logic input levels, the data input terminal of the third sequential logic device being connected to said other output terminal of the first sequential logic device and the output terminal of the third sequential logic device being connected to the data input terminal of the second sequential logic device, first and second switches each having an input terminal and an output terminal and each having a conductive state in which the signal level present at the input terminal of the switch is propagated to the output terminal of the switch and a non-conductive state in which the output terminal of the switch is isolated from the input terminal of the switch, the input terminal of the first switch being connected to the clock terminal of the circuit, a frequency scaler connected between the clock terminal of the circuit and the input terminal of the second switch, and a second combinational logic device having first and second input terminals connected respectively to the output terminals of the first and second switches and also having an output terminal connected to the clock input terminals of the first, second and third sequential logic devices, and wherein the control means place the coupling means in the first state thereof by placing the first switch in its conductive state and the second switch in its non-conductive state and place the coupling means in the second state thereof by placing the first switch in its non-conductive state and the second switch in its conductive state.

6. A circuit according to claim 2, wherein the first sequential logic device comprises a first D-type flip-flop having its Q output terminal connected to the coupling means and its /Q output terminal connected to the first input terminal of the combinational logic device, and the second sequential logic device comprises a second D-type flip-flop having its Q output terminal connected to the second input terminal of the combinational logic device.

7. A circuit according to claim 6, wherein the combinational logic device is a NOR gate.

8. A circuit according to claim 6, wherein the coupling means comprise:
- an OR gate having first and second input terminals and having an output terminal connected to the D input terminal of the second D-type flip-flop,
- a switch connected between the Q output terminal of the first D-type flip-flop and the first input terminal of the OR gate and having a conductive state and a non-conductive state,
- a third D-type flip-flop having its D input terminal connected to the Q output terminal of the first D-type flip-flop, its Q output terminal connected to the second input terminal of the OR gate, and its clock input terminal connected to the clock terminal of the circuit,
- and wherein the control means place the coupling means in the first or second state thereof by placing the switch in its conductive state or its non-conductive state.

9. A circuit according to claim 6, wherein the coupling means comprise:
- an OR gate having an output terminal connected to the clock input terminal of the second D-type flip-flop and also having first and second input terminals,
- first and second switches each having an input terminal and an output terminal and each having a conductive state and a non-conductive state, the output terminals of the switches being connected to the input terminals respectively of the OR gate and the input terminal of the first switch being connected to the clock terminal of the circuit,
- a frequency scaler connected between the clock terminal of the circuit and the input terminal of the second switch, and
- a third D-type flip-flop having its clock terminal connected to the output terminal of the OR gate, its D input terminal connected to the Q output terminal of the first D-type flip-flop and its Q output terminal connected to the D input terminal of the second D-type flip-flop,
- and wherein the control means place the coupling means in the first state thereof by placing the first switch in its conductive state and the second switch in its non-conductive state and place the coupling means in the second state thereof by placing the first switch in its non-conductive state and the second switch in its conductive state.

10. A circuit according to claim 6, wherein the coupling means comprise:
- an OR gate having an output terminal connected to the D input terminal of the second D-type flip-flop and also having first and second input terminals,
- a switch having an output terminal connected to the first input terminal of the OR gate and also having an input terminal, the switch having a conductive state and a non-conductive state,
- a third D-type flip-flop having its clock input terminal connected to the clock terminal of the circuit, its D input terminal connected to the Q output terminal of the first D-type flip-flop and its Q output terminal connected to the input terminal of the switch, and
- a fourth D-type flip-flop having its clock input terminal connected to the clock terminal of the circuit, its Q output terminal connected to the second input terminal of the OR gate and its D input terminal connected to the Q output terminal of the third D-type flip-flop,
- and wherein the control means place the coupling means in the first or second state thereof by placing the switch in its conductive state or its non-conductive state.

11. A circuit according to claim 6, wherein the clock input terminal of the second D-type flip-flop is connected to a circuit node, and the circuit further comprises an OR gate having an output terminal connected to the clock input terminal of the first D-type flip-flop and first and second input terminals, and a switch having an input terminal connected to said circuit node and having an output terminal connected to the first input terminal of the OR gate, the switch having a conductive state and a non-conductive state, so that when the second input terminal of the OR gate is isolated and the switch is conductive, signal levels that are applied to the clock input terminal of the second D-type flip-flop by way of said circuit node are propagated to the clock input terminal of the first D-type flip-flop.

* * * * *